United States Patent [19]

Davies

[11] Patent Number: 5,543,979
[45] Date of Patent: Aug. 6, 1996

[54] PREAMPLIFIER CIRCUIT ARRANGEMENTS FOR COMMON CURRENT FLOW IN A TRANSDUCER

[75] Inventor: Richard Davies, Cheshire, United Kingdom

[73] Assignee: Plessey Semiconductors Limited, United Kingdom

[21] Appl. No.: 302,514

[22] Filed: Sep. 8, 1994

[30] Foreign Application Priority Data

Sep. 15, 1993 [GB] United Kingdom ............... 9319106

[51] Int. Cl.⁶ .............................................. G11B 5/02
[52] U.S. Cl. ........................................ 360/67; 327/561
[58] Field of Search ............................ 330/254, 252, 330/261, 265; 360/46, 67, 68, 22, 39, 40, 61, 62, 65, 66; 327/561

[56] References Cited

U.S. PATENT DOCUMENTS

| | | | |
|---|---|---|---|
| 4,195,267 | 3/1980 | Stanley | 330/265 |
| 5,132,852 | 7/1992 | Price, Jr. | 360/46 |
| 5,150,073 | 9/1992 | Murari et al. | 360/68 X |
| 5,331,478 | 7/1994 | Aranovsky | 360/67 |

FOREIGN PATENT DOCUMENTS

| | | |
|---|---|---|
| 0053343A1 | 6/1982 | European Pat. Off. . |
| 283593 | 9/1988 | European Pat. Off. . |
| 643479 | 3/1995 | European Pat. Off. . |
| 1202705 | 8/1970 | United Kingdom . |

*Primary Examiner*—Aristotelis Psitos
*Assistant Examiner*—Patrick Wamsley
*Attorney, Agent, or Firm*—Kirschstein, et al.

[57] ABSTRACT

A preamplifier circuit arrangement for a magnetic or magneto resistive transducer, such as a record/replay head, in which a cascode preamplifier stage, and a stage providing a floating reference voltage for a following amplifier, are linked by an emitter coupled pair of transistors, one in each stage, such that the d.c. currents in the two stages flow in common through the transducer.

4 Claims, 1 Drawing Sheet

FIG. 1

PREAMPLIFIER CIRCUIT ARRANGEMENTS FOR COMMON CURRENT FLOW IN A TRANSDUCER

BACKGROUND OF THE INVENTION

This present invention relates to preamplifier circuit arrangements, and in particular to preamplifier circuit arrangements for use with magnetic or magnetoresistive transducer or record/replay heads.

Such magnetic or magnetoresistive heads commonly require a relatively high bias current in order to develop a usable output signal, and this requirement is in conflict with the desirability of keeping down the current levels and hence power dissipation in the preamplifier circuit arrangements to which the heads are connected.

SUMMARY OF THE INVENTION

According to the present invention a preamplifier circuit arrangement for a magnetic or magnetoresistive transducer or record/replay head comprises an emitter-coupled pair of transistors having respective constant current sources in their collector circuits and bias circuit means to apply d.c. biases to their respective bases, means to connect said transducer or record/replay head between said coupled emitters and a point of ground potential, and means to connect one of said pair of transistors in common base mode to alternating signal currents flowing in said transducer or record/replay head, the arrangement being such that alternating output signals may be derived from the collector circuit of said one of said pair of transistors.

Preferably the collector circuits of said emitter-coupled pair of transistors are connected to respective inputs of an amplifier providing differential output signals.

BRIEF DESCRIPTION OF THE DRAWING

A preamplitier circuit arrangement in accordance with the present invention will now be described by way of example with reference to FIG. 1 of the accompanying drawing, which shows the arrangement diagrammatically.

DETAILED DESCRIPTION OF THE PREFERRED EMBODIMENT

Figure 1:
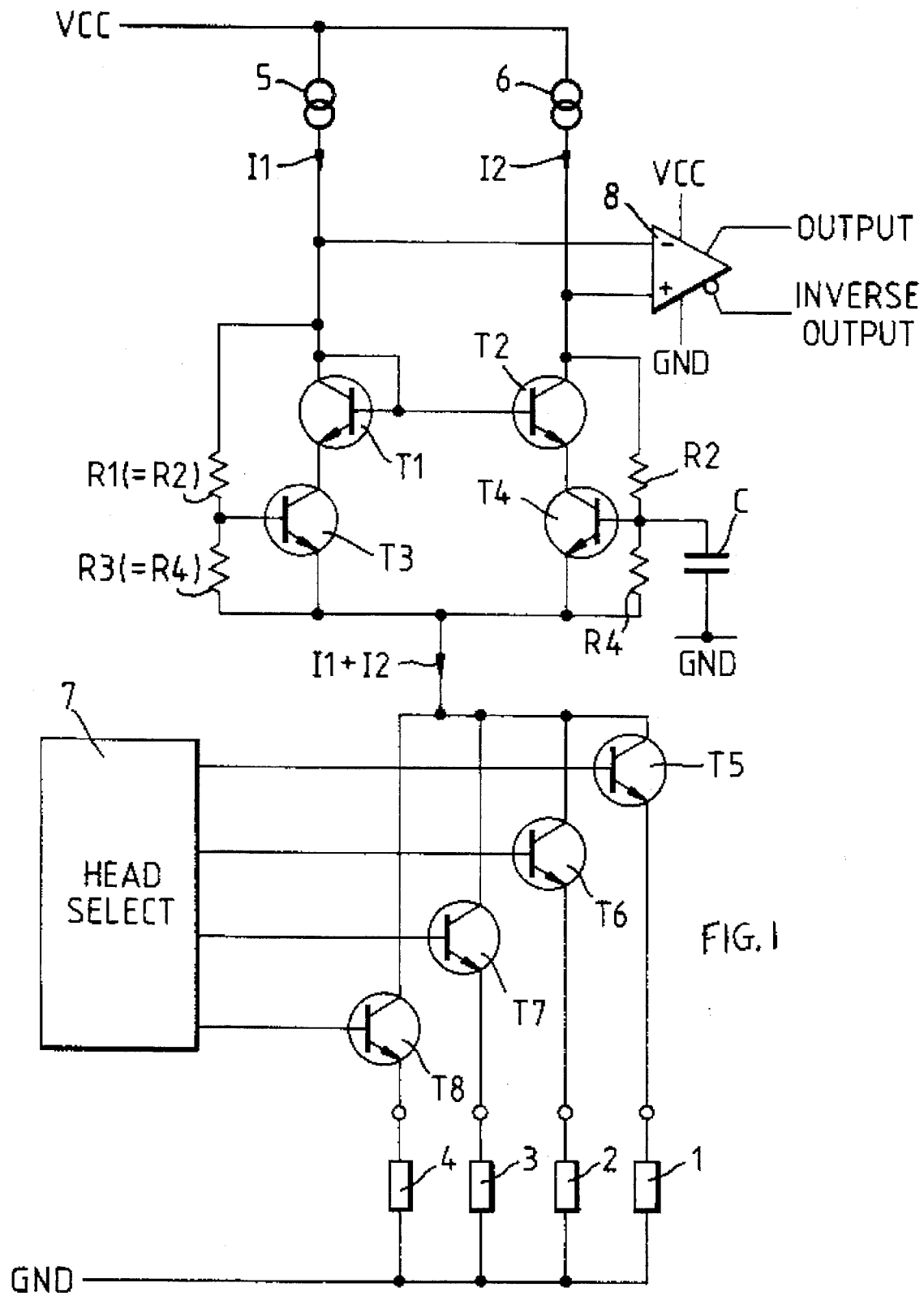

Referring to the drawing any one of four magnetoresistive heads 1 to 4 may be selected to receive a constant bias current I1+I2 from sources 5 and 6 in dependence upon which of four transistors T5 to T8 is biased into conduction by a head select circuit 7. The bias current sources 5 and 6 are connected in the collector circuits of an emitter coupled pair of transistors T3 and T4, the d.c. bias conditions of which are fixed by a biasing circuit comprising transistors T1 and T2 and resistors R1 to R4.

By means of a capacitor C connected between the base of transistor T4 and ground transistor T4 is arranged to operate in common base mode in respect of any alternating currents which may flow in the selected magneto resistive head 1 to 4, the resultant alternating output voltages developed across resistor R2 being applied to one input of a differential output amplifier 8, the other input of which is connected for reference to the collector of the transistor T1.

circuit comprising the current source 6 and the transistors T2 and T4 applies amplified signals from the selected head 1 to 4 to one input of the amplifier 8, while the circuit comprising the current source 5 and the transistors T1 and T3 establishes a reference voltage for the other input of the amplifier 8. Since the currents I1 and I2 from the sources 5 and 6 are passed in common tough the selected head 1 to 4, the circuit arrangement requires typically half the current of prior arrangements.

The common ground connection enables head selection to be implemented efficiently, saving components and power, and requires fewer pins on the circuit package.

Each of the heads 1 to 4 may have a resistance of the order of ten ohms, and the sum of the currents I1 and I2 may be of the order of fifteen to twenty-five milliamps. The resistors R1 and R2 may each be, say, eight hundred ohms while the resistors R3 and R4 may each be, say, one thousand six hundred ohms.

I claim:

1. A preamplifier circuit arrangement for a magnetic or magnetoresistive transducer or record and replay head, comprising; an emitter-coupled pair of transistors having respective constant current sources in their collector circuits and bias circuit means to apply d.c. biases to their respective bases, means to connect said transducer or record and replay head between said emitter-coupled pair of transistors and a point of ground potential, means to connect one of said pair of transistors in common base mode to alternating signal currents flowing in said transducer or record and replay head, and means to derive alternating output signals from the collector circuit of said one of said pair of transistors.

2. A preamplifier circuit arrangement for any selected one of a plurality of magnetic or magnetoresistive transducers or record and replay heads, comprising: an emitter-coupled pair of transistors having respective construct current sources in their collector circuits and bias circuit means to apply d.c. biases to their respective bases, respective switching means selectively to connect any one of said transducers or record and replay heads between said emitter-coupled pair of transistors and a point of ground potential, means to connect one of said pair of transistors in common base mode to alternating signal currents flowing in said one of said transducers or record and replay heads, and means to derive alternating output signals from the collector circuit of said one of said pair of transistors.

3. A preamplifier circuit in accordance with claim 2 wherein said switching means comprises a respective switching transistor connected between said emitter coupled emitters and each of said transducers or record and replay heads.

4. A preamplifier circuit in accordance with claim 1, wherein the collector circuits of said embitter-coupled pair of transistors are coupled to respective inputs of an amplifier providing differential output signals.

* * * * *